(12) United States Patent
Nagao et al.

(10) Patent No.: US 7,250,575 B2
(45) Date of Patent: Jul. 31, 2007

(54) WIRING BOARD, SEMICONDUCTOR DEVICE AND DISPLAY MODULE

(75) Inventors: Kouichi Nagao, Kyoto (JP); Yoshifumi Nakamura, Osaka (JP); Hiroyuki Imamura, Osaka (JP); Michinari Tetani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/441,678

(22) Filed: May 26, 2006

(65) Prior Publication Data

US 2006/0268530 A1 Nov. 30, 2006

(30) Foreign Application Priority Data

May 30, 2005 (JP) .............................. 2005-157738

(51) Int. Cl.
*H05K 3/46* (2006.01)

(52) U.S. Cl. ...................... 174/254; 174/250; 349/150; 361/749; 257/668

(58) Field of Classification Search ................ 361/760, 361/749; 174/250, 254, 256, 257, 260; 349/149, 349/150, 152; 257/666, 668
See application file for complete search history.

(56) References Cited

U.S. PATENT DOCUMENTS

| | | | | |
|---|---|---|---|---|
| 5,510,918 | A * | 4/1996 | Matsunaga et al. | 349/149 |
| 6,252,176 | B1 * | 6/2001 | Kuramochi et al. | 174/255 |
| 6,455,786 | B1 * | 9/2002 | Horiuchi et al. | 174/260 |
| 6,559,522 | B1 * | 5/2003 | Kang | 257/668 |
| 6,677,664 | B2 * | 1/2004 | Inoue et al. | 257/668 |
| 2005/0111205 | A1 * | 5/2005 | Sumi et al. | 361/760 |

FOREIGN PATENT DOCUMENTS

| | | | |
|---|---|---|---|
| JP | 5-326643 | | 12/1993 |
| JP | 2000012726 | * | 1/2000 |
| JP | 2001-93942 | | 4/2001 |
| JP | 2005039109 | * | 2/2005 |
| JP | 2005109377 | * | 4/2005 |

* cited by examiner

*Primary Examiner*—Michael C. Zarroli
(74) *Attorney, Agent, or Firm*—Hamre, Schumann, Mueller & Larson, P.C.

(57) ABSTRACT

A wiring board includes: a flexible insulating base 1; a plurality of conductive wirings 2 arranged on the flexible insulating base 1; protruding electrodes 3 provided respectively at an end portion of the same side of each of the conductive wirings; external terminals 4, 5 formed respectively at the other end portions of each of the conductive wirings; metal plating layers applied on the conductive wirings, the protruding electrodes and the external terminals; and solder resist layers 7 formed respectively by coating the conductive wirings in regions between the end portions at which the protruding electrodes are provided and the external terminals. In the regions where the solder resist layers are formed, no metal plating layers are formed on the conductive wirings, and the surfaces of the conductive wirings to be contacted with the flexible insulating base are rougher than the surfaces not to be contacted with the flexible insulating base. Even when a film base is thin, bending stress applied to the conductive wirings is relieved sufficiently, and thus breaks in the wirings are suppressed.

11 Claims, 5 Drawing Sheets

WIRING BOARD, SEMICONDUCTOR DEVICE AND DISPLAY MODULE

BACKGROUND OF THE INVENTION

1. Field of the Invention

The present invention relates to a wiring board such as a tape carrier substrate formed by providing a conductive wiring on a flexible insulating base. Particularly, the present invention relates to a structure of a wiring board having conductive wirings whose folding resistance is improved.

2. Description of Related Art

As one type of package module using a tape carrier substrate, the one employing a COF (Chip On Film) has been known. The COF includes a semiconductor chip mounted on a flexible insulating tape carrier substrate and the mounted portion is protected by sealing with a resin. The tape carrier substrate includes as main components an insulating film base and a plurality of conductive wirings formed on a surface of the film base. In general, polyimide is used as a material of the film base and copper is used as a material of the conductive wirings. As required, a metal plating film and a solder resist layer as an insulating resin are formed on the conductive wirings.

The COF is used mainly for packaging a driver for driving a display panel such as a liquid crystal panel. In such a case, conductive wirings on the tape carrier substrate are arranged in two groups of a first group for forming external terminals for output signals and a second group for forming external terminals for input signals, and a semiconductor chip is packaged between the first group of conductive wirings and the second group of conductive wirings. The first group of conductive wirings forming the external terminals for output signals are connected to electrodes formed in the periphery of the display panel, and the second group of conductive wirings forming the external terminals for input signals are connected to terminals of a mother board.

On the other hand, a packaging method of folding the tape carrier substrate at its end portion is used for providing a smaller structure to be packaged in the display panel. For facilitating folding at an acute angle, it is known to previously form a slit at the portion of the film base to be folded so as to fold only a copper foil lead that forms the conductive wirings.

However, in the structure, since the film base is not provided at the folded portion where the slit is formed, mechanical stress during the packaging or stress caused by a heat cycle or the like will be concentrated to the conductive wirings made of a thin copper lead, and cracks and ruptures in the conductive wirings can occur easily. Particularly, in a case of Sn plating or Sn-Pb plating both of which are provided most widely on conductive wiring, a brittle Cu-Sn diffused alloy layer is formed on the interface between the copper foil lead and the plating due to the heat applied during the package assembly process, and thus the folding resistance of the conductive wirings is degraded considerably.

A structure for improving the folding resistance of the conductive wirings is described in JP H05-326643 A, for example. In this structure, either Sn or Sn alloy is not plated on the surface of the copper foil lead positioned on a folding slit formed on a film base, and furthermore, a flexible resin film (solder resist) having a plating resistance and insulation is provided on the surface of a copper lead positioned on the folding slit.

However, even in the wiring board having the above-mentioned conventional structure, folding resistance of the conductive wirings made of a copper lead cannot be sufficient anymore. The reason is that, in accordance with the trend for smaller packages using tape carrier substrates, thicknesses for all the components have been reduced. For example, the thickness of the film base of polyimide is about 40 µm, the thickness of the conductive wirings is about 8 µm, and the thickness of the solder resist is about 15 µm. As a result, even at the time of folding the conductive wirings with the film base, stress being not much different from the case of folding the conductive wirings alone will be applied, so that the conductive wirings can be broken easily. In light of this, there is a demand for a structure for relieving sufficiently the bending stress applied to the conductive wirings.

SUMMARY OF THE INVENTION

Therefore, with the foregoing in mind, it is an object of the present invention to provide a wiring board where bending stress applied to the conductive wirings is relieved sufficiently even when the thickness of the film base or the like is reduced, so that the occurrence of breaks in the wirings can be suppressed.

A wiring board of the present invention includes: a flexible insulating base; a plurality of conductive wirings arranged on the flexible insulating base; protruding electrodes provided respectively at one end portion of the same side of each of the conductive wirings; external terminals formed respectively at the other end portion of each of the conductive wirings; metal plating layers applied on the conductive wirings, the protruding electrodes and the external terminals; and solder resist layers formed respectively by coating the conductive wirings in a region between the end portions at which the protruding electrodes are provided and the external terminals. In the regions where the solder resist layers are formed, the metal plating layers are not formed on the conductive wirings, and furthermore, the surfaces of the conductive wirings to be contacted with the flexible insulating base is rougher than the surfaces not to be contacted with the flexible insulating base.

DETAILED DESCRIPTION OF THE INVENTION

Figure 1:
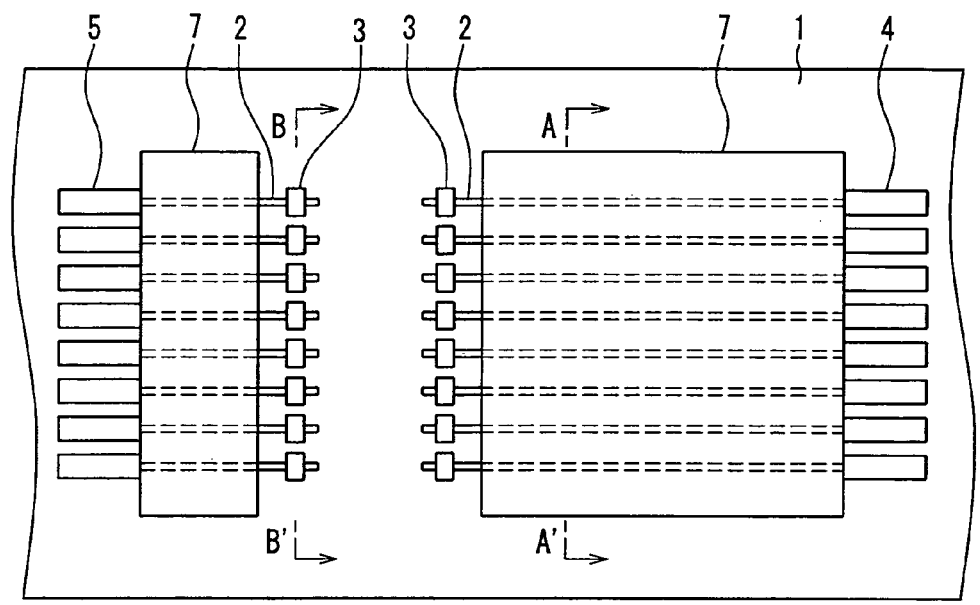
FIG. 1 is a plan view showing a wiring board according to an embodiment of the present invention.

According to the thus configured wiring board of the present invention, since metal plating layers are not applied on regions where solder resist layers are formed, increase in brittleness of the conductive wirings, which is caused by formation of the metal plating layers, can be avoided. Moreover, by roughening the surfaces of the conductive wirings at the portions to be contacted with the base, adherence between the conductive wirings and the base is increased. Furthermore, due to the structure of sandwiching the conductive wirings between the base and the solder resist layers, the conductive wirings are fixed to the base so as to improve the effect of relieving the bending stress. As a result, by positioning a folding portion in regions where the solder resist layers are formed, occurrence of breaks in the conductive wirings can be suppressed.

It is preferable in the wiring board of the present invention that the elastic moduli and the thicknesses of the materials for forming the flexible insulating base, the conductive wirings and the solder resist layers are determined so that a neutral plane in the thickness direction of the cross section across the conductive wirings in the laminate structure including the flexible insulating base, the conductive wirings and the solder resist layers, is positioned passing through the conductive wirings.

Thereby, the distortion that will occur in the conductive wirings at the time of folding the wiring board can be minimized, and which can maximize the effect of suppressing breaks in the conductive wirings caused by the folding.

It is also preferable that the elastic modulus of the solder resist layers is determined to be smaller than the elastic modulus of the conductive wirings and larger than the elastic modulus of the flexible insulating base. In that case, the solder resist layers can be thicker than the conductive wirings and thinner than the flexible insulating base.

In the thus configured wiring board, the protruding electrodes are formed across the longitudinal direction of the conductive wirings so as to extend over regions on both sides of the conductive wirings above the flexible insulating base, and a cross sectional shape of each of the protruding electrodes taken in a width direction of the conductive wirings can be such that a central portion is higher than portions on both sides of the central portion.

The metal for forming the conductive wirings and the protruding electrodes can be copper. And the metal plating layers applied on the conductive wirings and the protruding electrodes can be gold plating layers.

For the plural conductive wirings, the first group of conductive wirings and the second group of conductive wirings are arranged in the same direction with a predetermined pitch, the protruding electrodes are arranged at the inner end portions of the conductive wirings of the respective groups, and the external terminals are arranged at the external end portions of the conductive wirings of the respective groups.

A semiconductor device of the present invention includes a wiring board of any of the above-mentioned structure, a semiconductor chip mounted on the wiring board, and an insulating resin layer provided to intervene between the wiring board and the semiconductor chip, where the semiconductor chip has electrode pads connected to the conductive wirings via the protruding electrodes.

It is preferable in the semiconductor device that the insulating resin layer is formed so that its end portions overlap on the end portions of the solder resist layers.

A display module of the present invention includes a semiconductor device configured by mounting a semiconductor chip on a wiring board on which the first group of conductive wirings and the second group of conductive wirings are formed, a display panel, and a mother board. The electrode pads of the semiconductor chip are connected to the conductive wirings via the protruding electrodes. The insulating resin layer is provided to intervene between the wiring board and the semiconductor chip. The first external terminals provided to the first group of conductive wirings of the semiconductor device and connection terminals of the display panel are connected to each other, and the second external terminals provided to the second group of conductive wirings of the semiconductor device and connection terminals of the mother board are connected to each other. And the wiring board is folded at the regions of the solder resist layers.

Hereinafter, the present invention will be described by way of illustrative embodiments with reference to the drawings.

FIG. 1 is a plan view showing a wiring board according to an embodiment of the present invention. Numeral 1 denotes a flexible insulating base on which a plurality of conductive wirings 2 are arranged. In this embodiment, the plural conductive wirings 2 are classified into a first group in the right of the figure and a second group in the left of the figure, and arranged in the same direction with a predetermined pitch. The inner end portions of the conductive wirings 2 of the first and second groups form chip mounting end portions for mounting a semiconductor chip, at which protruding electrodes 3 are provided respectively. When the semiconductor chip is mounted, the protruding electrodes 3 are bonded to the electrode pads. First external terminals 4 are provided at the external end portions of the conductive wirings 2 of the first group, and second external terminals 5 are provided at the external end portions of the conductive wirings 2 of the second group. The base 1 can be made of polyimide for example, and the conductive wirings 2 and the protruding electrodes 3 can be made of copper for example.

Figure 2A:
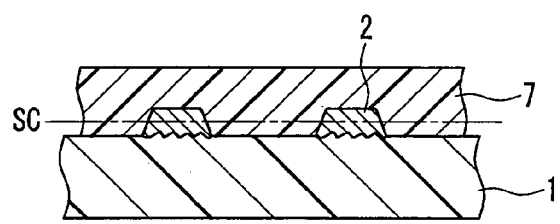
FIG. 2A is a cross-sectional view taken along a line A-A' in FIG. 1.
Figure 2B:
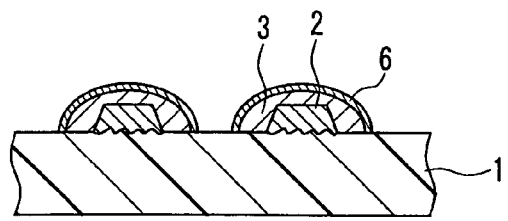
FIG. 2B is a cross-sectional view taken along a line B-B' in FIG. 1.

On the conductive wirings 2 in the respective middle regions between the end portions to which the protruding electrodes 3 are provided and the first and second external terminals 4, 5, solder resist layers 7 of for example, epoxy resin or the like are formed. For the solder resist layers 7, polyimide resin or the like can be used. FIG. 2A shows a cross section taken along a line A-A' in the region where one of the solder resist layers 7 is provided. As shown in this figure, in the region where the solder resist layer 7 is formed, the conductive wirings 2 and the solder resist layer 7 are contacted directly with each other. FIG. 2B shows a cross section taken along a line B-B' in the region of the protruding electrodes 3 where the solder resist layers 7 are not formed. As shown in this figure, metal plating layers 6 are applied on the protruding electrodes 3. Similarly, the metal plating layers 6 are applied to the conductive wirings 2 and the external terminals 4, 5 on the region where the solder resist layers 7 are not provided (not shown). The metal plating layers 6 can be Au plating, Sn plating and the like.

The surfaces of the conductive wirings 2 to be contacted with the base 2 are roughened more than the surfaces not to be contacted with the base 1 (i.e., the upper surfaces). The surface roughness of the surfaces of the conductive wirings 2 to be contacted with the base 1 is in a range of 0.5 µm to 1.0 µm preferably. The surface roughness of the surfaces of the conductive wirings 2 not to be contacted with the base 1 is in a range of 0.1 µm to 0.5 µm.

In FIG. 2A, SC denotes a neutral plane in the thickness direction of the cross section across the conductive wirings 2 in a laminate structure made of the base 1, the conductive wirings 2 and the solder resist layer 7. In the region where the solder resist layer 7 is formed, the elastic moduli and the thicknesses of the materials forming the base 1, the conductive wirings 2 and the solder resist layer 7 are determined so that the neutral plane SC is positioned passing through the conductive wirings 2. Therefore, when the wiring board is folded in the region as shown in FIG. 2A where the solder resist layer 7 is formed, the distortion occurring in the conductive wirings 2 is minimized, and thus breaks in the conductive wirings 2 due to the folding is suppressed.

The elastic modulus of the solder resist layer 7 is determined to be smaller than the elastic modulus of the conductive wirings 2 and larger than the elastic modulus of the base 1. Therefore, the solder resist layer 7 is determined to be thicker than the conductive wirings 2 and thinner than the base 1, and thus the neutral plane SC can be positioned passing through the conductive wirings 2. For example, when the elastic modulus of the solder resist layer 7 is as twice as the elastic modulus of the base 1, the neutral plane SC will pass through the center of the conductive wirings 2 by making the thickness of the solder resist layer 7 to be half the thickness of the base 1, thereby providing a remarkable effect of suppressing breaks of the conductive wirings 2 caused by folding.

By determining the neutral plane SC to be positioned passing through the conductive wirings 2, the other combination of the elastic modulus and the thickness can achieve similar effects as well. For example, when the elastic modulus of the solder resist layer 7 is determined to be smaller than the elastic modulus of the conductive wirings 2 and also smaller than the elastic modulus of the base 1, the solder resist layer 7 is determined to be thicker than the conductive wirings 2 and also thicker than the base 1, so that the neutral plane SC can be determined to be positioned passing through the conductive wirings 2.

As shown in FIGS. 1 and 2B, the protruding electrodes 3 are formed across the longitudinal direction of the conductive wirings 2 so as to extend over regions on both sides of the conductive wirings 2 above the base 1, and a cross sectional shape of each of the conductive wirings 2 taken in a width direction of the conductive wirings 2 is such that a central portion is higher than portions on both sides of the central portion.

For the metal for forming the conductive wirings 2 and the protruding electrodes 3, copper is used for example. For the metal plating layers 6 formed on the conductive wirings 2 and the protruding electrodes 3, gold plating are used for example.

Figure 3:
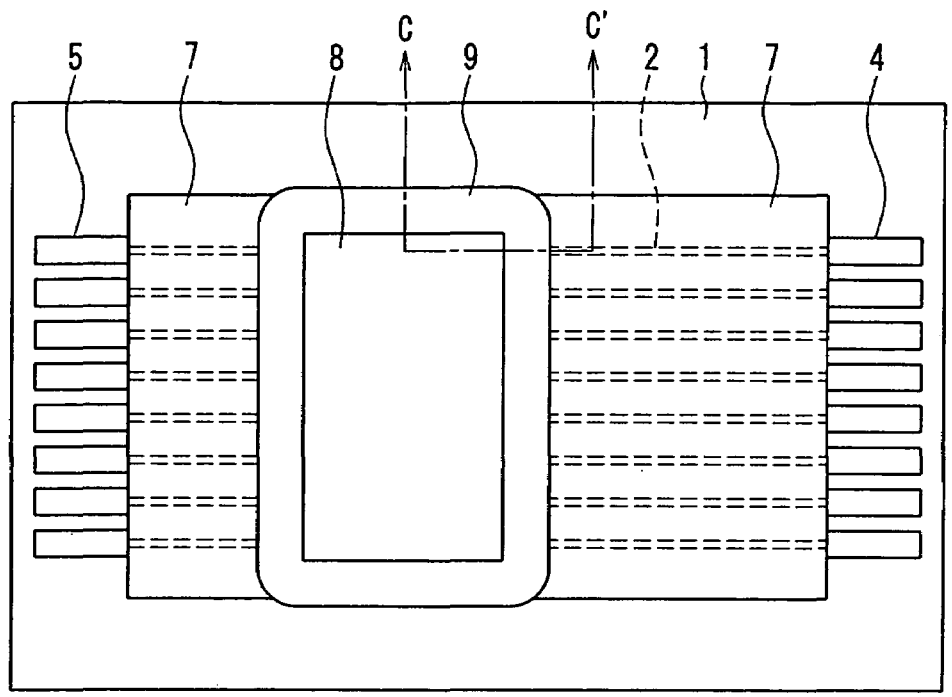
FIG. 3 is a plan view showing a semiconductor device in an embodiment of the present invention.
Figure 4:
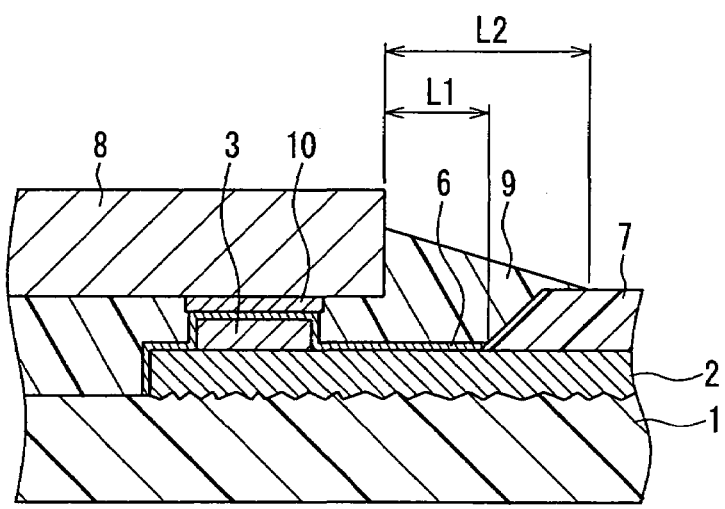
FIG. 4 is an enlarged cross-sectional view showing a main part taken along a line C-C' in FIG. 3.

FIG. 3 shows one structural example of a semiconductor device 11 configured by packaging a semiconductor chip 8 on the above-mentioned wiring board. The semiconductor chip 8 is mounted in the space between the inner end portions of the two groups of conductive wirings 2. An insulating resin layer 9 is provided to intervene between the wiring board and the semiconductor chip 8 mounted on the wiring board. FIG. 4 shows the main part of the cross section taken along the line C-C' in FIG. 3. As shown in FIG. 4, an electrode pad 10 of the semiconductor chip 8 is connected to the conductive wiring 2 via the protruding electrode 3. The insulating resin layer 9 is formed so that its end portion overlaps on the end portion of the solder resist layer 7. Thereby, the spacing between the semiconductor chip 8 and the region of the solder resist layer 7 is filled with the insulating resin layer 9, and thus a drastic change in the thickness can be avoided. This structure is also effective in suppressing breaks since the conductive wirings 2 tend to break in a region whose thickness changes considerably.

Figure 5:
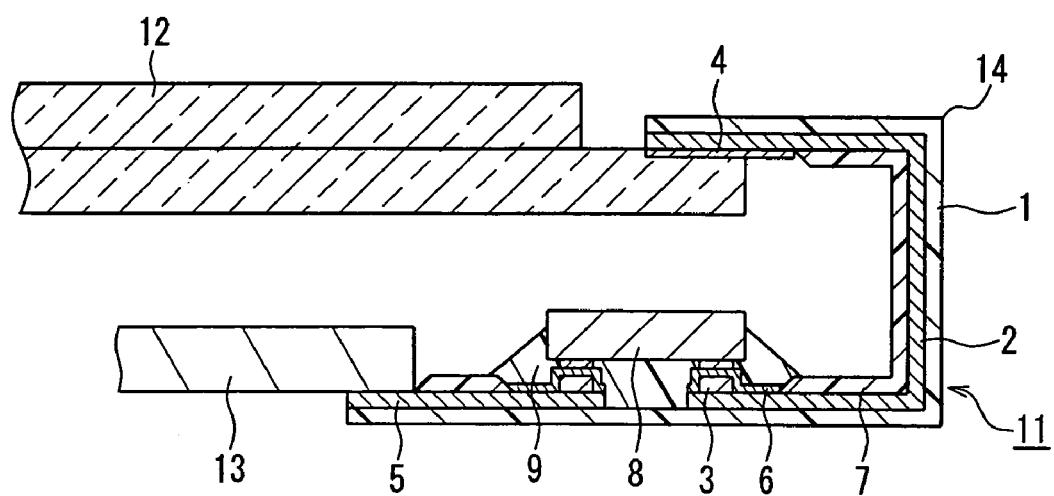
FIG. 5 is a cross-sectional view showing a main part of a display module according to an embodiment of the present invention.

FIG. 5 is a cross-sectional view showing a display module including the semiconductor device 11 configured by mounting the semiconductor chip 8 on the wiring board, a display panel 12, and a mother board 13. The first external terminal 4 provided to the conductive wiring 2 of the first group in the semiconductor device 11 and a connection terminal (not shown) of the display panel 12 are connected to each other. The second external terminal 5 provided to the conductive wiring 2 of the second group in the semiconductor device 11 and a connection terminal (not shown) of the mother board 13 are connected to each other. The semiconductor device 11 is folded in the region of the solder resist layer 7 of the wiring board so as to form a folded portion 14.

Since the folded portion 14 is located in the region of the solder resist layer 7, breaks in the conductive wiring 2 caused by the folding can be suppressed effectively. That is, in the region where the solder resist layer 7 is formed, as mentioned above, no metal plating layer is applied to the conductive wiring 2, and the surface of the conductive wiring 2 to be contacted with the base 1 is rougher than the surface not to be contacted with the base 1. Since a metal plating layer is not applied, increase in brittleness of the conductive wiring 2 due to the formation of the metal plating layer can be avoided. Furthermore, the adherence between the conductive wiring 2 and the base 1 is increased by roughening the surface of the conductive wiring 2 to be contacted with the base 1, and moreover, due to the structure of sandwiching the conductive wiring 2 between the base 1 and the solder resist layer 7, the conductive wiring 2 is fixed to the base 1 so as to improve the effect of relieving the bending stress. Due to the effects, breaks in the conductive wiring 2 caused by the folding can be suppressed. The above-mentioned effect can provide a great advantage since the base 1 and the conductive wiring 2 tend to peel off from each other in a case of folding with the solder resist layer 7 inside the laminate.

Furthermore, as having been explained with reference to FIG. 2A, since the neutral plane SC on the cross section of the laminate including the base 1, the conductive wiring 2 and the solder resist layer 7 passes through the conductive wiring 2, the distortion occurring in the conductive wiring 2 at the time of folding the wiring board is minimized, and thus the effect of suppressing the breaks in the conductive wiring 2 caused by the folding can be maximized.

Next, the method for producing the wiring board of the above-mentioned structure will be explained below with reference to FIGS. 6A-6E and 7A-7D. FIGS. 6A-6E show a cross section taken along the line A-A' in FIG. 1, in a process of producing the wiring board. FIGS. 7A-7D show a cross section taken along the line B-B' in FIG. 1.

Figure 6A:
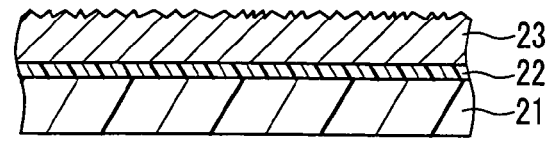
FIGS. 6A-6E are cross-sectional views showing a process of producing a wiring board according to an embodiment of the present invention.
Figure 6B:
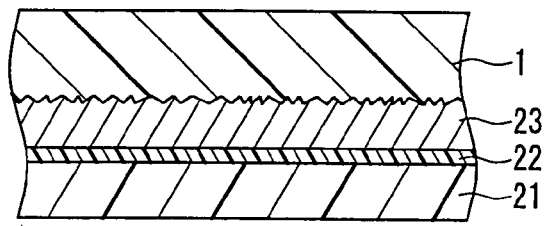
Figure 6C:
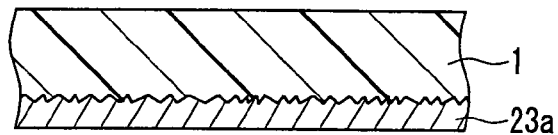
Figure 6D:
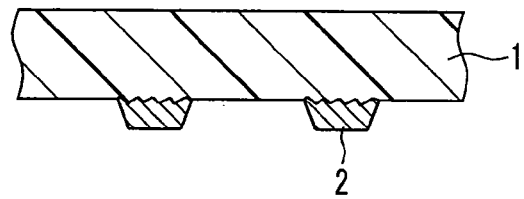
Figure 6E:
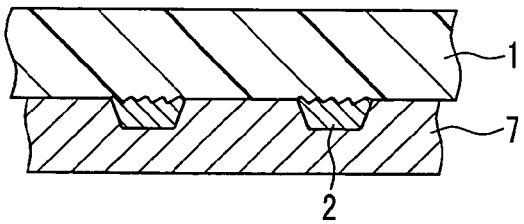

First, as shown in FIG. 6A, a conductive layer 23 is formed on a base layer 21 via a seed layer 22, and the surface of the conductive layer 23 is roughened. Next, as shown in FIG. 6B, a flexible insulating base 1 is formed on the conductive layer 23 and hardened. Next, as shown in FIG. 6C, the base layer 21 and the seed layer 22 are removed and subsequently the conductive layer 23 is half-etched to form a half-etched conductive layer 23a. Next, the conductive layer 23a is patterned by etching so as to form conductive wirings 2 as shown in FIG. 6D. Finally, as shown in FIG. 6E, a solder resist layer 7 is formed.

Figure 7A:
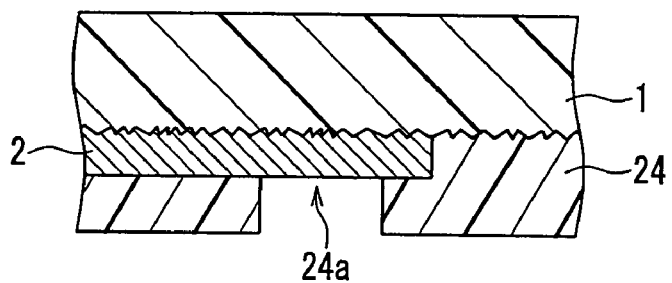
FIGS. 7A-7D are cross-sectional views showing another cross section in the same producing process.
Figure 7B:
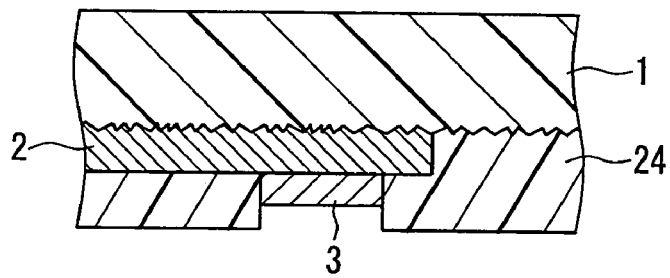
Figure 7C:
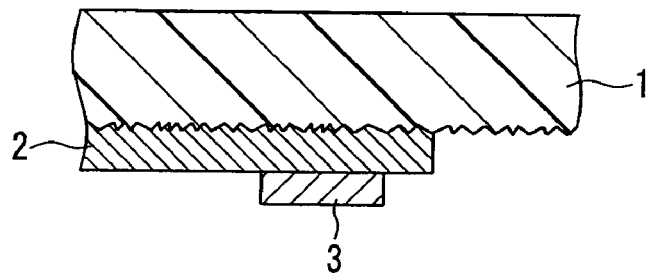
Figure 7D:
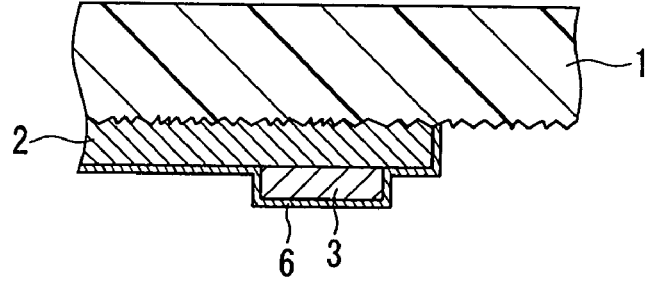

In the B-B' cross section, after forming the conductive wirings 2 as shown in FIG. 6D, a pattern of a photoresist 24 is formed to have an opening 24a opposing the end portion of the conductive wiring 2 as shown in FIG. 7A. Next, as shown in FIG. 7B, a protruding electrode 3 is formed by electroplating through the opening 24a. Next, the photoresist 24 is removed as shown in FIG. 7C, and the protruding electrode 3 and the conductive wirings 2 are electroplated (gold-plated) to form a metal plating layer 6.

Examples of the respective dimensions for the above-mentioned wiring board and the semiconductor device are indicated below. Although the conductive wirings 2 in FIG. 1 are illustrated uniformly in a simple manner, actually the inner leads as the end portions at which the protruding electrodes 3 are formed may be different from the other portions in the dimensions, the pitches and the like. The first and second external terminals 4, 5 are indicated to have the same pitch as the conductive wirings 2, actually the pitches may be different from each other.

Conductive Wiring 2
    Number: 300-900/pcs, Pitch: 30 μm-100 μm,
    Width: 15 μm-50 μm, Thickness: 6 μm-12 μm, Length: 5 mm-15 mm,
    Elastic modulus: 130-140 GPa Inner Lead
    Pitch: 35 μm-200 μm,
    Width: 10 μμm-20 μm, Thickness: 6 μm-12 μm, Length: 20 μm-60 μm First External Terminal 4
    Number: 250-700, Pitch: 70 μm-150 μm,
    Width: 35 μm-75 μm, Thickness: 6 μm-12 μm, Length: 1 mm-2 mm Second External Terminal 5
    Number: 40-200, Pitch: 200 μm-600 μm,
    Width: 100 μm-300 μm, Thickness: 6 μm-12 μm,
    Length: 1.5 mm-3 mm Base 1
    Width: 35 μm-70 μm, Thickness: 30 μm-60 μm,
    Elastic modulus: 4-10 GPa Protruding Electrode 3
    Width: 20 μm-50 μm, Height: 10 μm-30 μm, Length: 20 μm-50 μm Solder Resist 7
    Thickness: 10 μm-30 μm, Elastic modulus: 5-20 GPa Others
    Length of spacing between the first and second external terminals 4, 5: 9.5 mm-28.5 mm
    Spacing Li between semiconductor chip 8 and solder resist 7
    (see FIG. 4): 0.1 mm-0.4 mm
    Seal width L2 by insulating resin layer 9 (see FIG. 4): 0.3 mm-1.5 mm The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wiring board comprising:
   a flexible insulating base,
   a plurality of conductive wirings arranged on the flexible insulating base,
   protruding electrodes provided respectively at one end portion of the same side of each of the conductive wirings,
   external terminals formed respectively at the other end portion of each of the conductive wirings,
   metal plating layers applied on the conductive wirings, the protruding electrodes and the external terminals, and
   solder resist layers formed by coating the conductive wirings in a region between the end portions at which the protruding electrodes are provided and the external terminals,
   wherein in the regions where the solder resist layers are formed, the metal plating layers are not formed on the conductive wirings, and surfaces of the conductive wirings to be contacted with the flexible insulating base have a surface roughness greater than surfaces not to be contacted with the flexible insulating base.

2. The wiring board according to claim 1, wherein elastic moduli and thicknesses of materials forming the flexible insulating base, the conductive wirings and the solder resist layers are determined so that a neutral plane in the thickness direction of a cross section across the conductive wirings in a laminate structure comprising the flexible insulating base, the conductive wirings and the solder resist layers, is positioned passing through the conductive wirings.

3. The wiring board according to claim 1, wherein the elastic modulus of the solder resist layers is smaller than the elastic modulus of the conductive wirings and larger than the elastic modulus of the flexible insulating base.

4. The wiring board according to claim 3, wherein the solder resist layers are thicker than the conductive wirings and thinner than the flexible insulating base.

5. The wiring board according to claim 1, wherein the protruding electrodes are formed across the longitudinal direction of the conductive wirings so as to extend over regions of both sides of the conductive wirings above the flexible insulating base, and a cross sectional shape of each of the protruding electrodes taken in a width direction of the conductive wirings is such that a central portion is higher than portions on both sides of the central portion.

6. The wiring board according to claim 1, wherein the conductive wirings and the protruding electrodes are formed of a metal of copper.

7. The wiring board according to claim 6, wherein the metal plating layers applied on the conductive wirings and the protruding electrodes are gold plating layers.

8. The wiring board according to claim 1, wherein a first group of conductive wirings and a second group of conductive wirings as the plural conductive wirings are arranged in a same direction with a predetermined pitch, the protruding electrodes are arranged at the inner end portions of the conductive wirings of the respective groups, and the external terminals are arranged at the external end portions of the conductive wirings of the respective groups.

9. A semiconductor device comprising
   the wiring board according to claim 1,
   a semiconductor chip mounted on the wiring board, and
   an insulating resin layer provided to intervene between the wiring board and the semiconductor chip,
   wherein the semiconductor chip has electrode pads connected to the conductive wirings via the protruding electrodes.

10. The semiconductor device according to claim 9, wherein the insulating resin layer is formed so that its end portion overlaps on the end portion of the solder resist layer.

11. A display module comprising the semiconductor device configured by mounting a semiconductor chip on a wiring board according to claim 8, a display panel and a mother board, wherein
   the semiconductor chip has electrode pads connected to the conductive wirings via the protruding electrodes, an insulating resin layer is provided to intervene between the wiring board and the semiconductor chip,
   first external terminals provided to the first group of conductive wirings of the semiconductor device and connection terminals of the display panel are connected to each other, and second external terminals provided to the second group of conductive wirings of the semiconductor device and connection terminals of the mother board are connected to each other, and
   the wiring board has a structure folded in the regions having the solder resist layers.

\* \* \* \* \*